(12) United States Patent
Song

(10) Patent No.: US 6,545,918 B2
(45) Date of Patent: Apr. 8, 2003

(54) SEMICONDUCTOR MEMORY DEVICE HAVING BOOSTED VOLTAGE STABILIZATION CIRCUIT

(75) Inventor: Ho-young Song, Bucheon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/878,112

(22) Filed: Jun. 8, 2001

(65) Prior Publication Data

US 2001/0050867 A1 Dec. 13, 2001

(30) Foreign Application Priority Data

Jun. 13, 2000 (KR) .............................................. 00-32390

(51) Int. Cl.[7] ................................................. G11C 7/00
(52) U.S. Cl. .............. 365/189.11; 365/149; 365/230.03
(58) Field of Search ........................ 365/189.11, 230.03, 365/149, 189.01, 230.01

(56) References Cited

U.S. PATENT DOCUMENTS 5,699,289 A * 12/1997 Takenaka .................... 365/226
5,909,141 A * 6/1999 Tomishima .................. 327/534
6,229,753 B1 * 5/2001 Kono et al. ............. 365/189.11

FOREIGN PATENT DOCUMENTS

| KR | 95-8673 | 8/1995 |
| KR | 98-152956 | 6/1998 |

* cited by examiner

*Primary Examiner*—Hoai Ho
(74) *Attorney, Agent, or Firm*—Harness, Dickey & Pierce, PLC

(57) ABSTRACT

A semiconductor memory device having a boosted voltage stabilization circuit includes a plurality of memory cell array blocks sharing a predetermined circuit that is operable to use a boosted voltage higher than a power supply voltage. The device also includes a voltage stabilization circuit comprising an additional load for being charged with the boosted voltage when a memory cell array block at an edge of the cell array is selected. Accordingly, the boosted voltage stabilization circuit enables the semiconductor memory device to use a uniform single boosted voltage level regardless of the location of the selected cell array block, thereby preventing the reduction in the life span of the device or the deterioration in the operating characteristics of the device that is normally caused by excessive increases in the boosted voltage level.

16 Claims, 6 Drawing Sheets

SEMICONDUCTOR MEMORY DEVICE HAVING BOOSTED VOLTAGE STABILIZATION CIRCUIT

CLAIM OF PRIORITY

This application claims the benefit of priority under 35 U.S.C. §119(a) of Korean Patent Application No. 2000-32390 filed on Jun. 13, 2000. A certified copy of the Korean Patent Application is submitted concurrently herewith.

BACKGROUND

1. Field of the Invention

The present invention relates to semiconductor memory devices, and more particularly, a semiconductor memory device having a voltage stabilization circuit that is capable of stabilizing a boosted voltage level.

2. Description of the Related Art

In dynamic random access memories (DRAMs), a boosted voltage, which is a voltage higher than the power supply voltage by a threshold voltage amount or higher, is used for controlling cell transistors. Boosted voltage is used because it takes a relatively long time to transmit the charge stored in a cell capacitor to the bit line, and to transmit a sufficient voltage of a bit line to a cell capacitor while storing data. Therefore, a boosted voltage generation circuit is one of the essential circuits in a DRAM.

During the operation of a memory formed of silicon, a boosted voltage Vpp depends on the number of circuits, the amount of charge used by each circuit, and the performance of each circuit in compensating for the amount of charge that is used. Circuits used for generating the boosted voltage Vpp include a boosted voltage Vpp pump and an active kicker. However, when the compensation performance of the pump and active kicker are fixed, the level of boosted voltage Vpp changes or fluctuates. In other words, in a case where a small amount of boosted voltage Vpp is used, the level of the boosted voltage Vpp increases when the amount of charge compensated for is larger than the amount of boosted voltage Vpp used. In contrast, in a case where a large amount of boosted voltage Vpp is used, the level of boosted voltage Vpp decreases when the amount of charge compensated for is smaller than the amount of the boosted voltage Vpp used.

When a memory cell array comprised of block units is activated in a DRAM, a boosted voltage Vpp load varies depending on the position of the block unit in the cell array. The load varies depending on whether a block unit located near the edge (e.g., outer) of the cell array is selected, or a block unit located in the interior (e.g., inside) of the cell array is selected. For example, for a memory device comprised of four cell array blocks, depending on the location of the activated cell array block, the maximum amount of boosted voltage Vpp used (e.g., the maximum amount of charge consumption) can be twice as large as the minimum amount of charge consumption.

FIG. 1 illustrates a main path through which a boosted voltage Vpp is applied when a row address strobe (RAS) is active in a conventional DRAM. Reference numerals 10 and 11 designate a first cell array block and a second cell array block, respectively. Reference numerals 14 and 16 designate selection control signal Pxi drivers used in selecting a cell array block. Reference numeral 12 denotes a broken line, which designates an output line of selection control signal Pxi driver 14. Reference numeral 13 denotes a thick solid line, which designates an output line of selection control signal Pxi driver 16.

Signals Px0a and Px2a can be used to select selection control Pxi drivers 14 and 16, respectively, and are generated based on an address. The selected selection control signal Pxi driver (e.g., selection control signal Pxi driver 14 or selection control signal Pxi driver 16) outputs a boosted voltage Vpp to a word line through a sub-word line driver 15, 17, or 18. The structure and operation of selection control signal Pxi drivers 14 and 16, and sub-word line drivers 15, 17, and 18 are apparent to those skilled in the art, and thus, further descriptions of the components are not provided.

DRAMs are designed such that two adjacent cell array blocks share a control signal Pxi driver and an output line. For example, as depicted in FIG. 1, two adjacent cell array blocks, first cell array block 10 and second cell array block 11, share selection control signal Pxi driver 16 and output line 13. However, selection control signal Pxi driver 14, located at the edge of the memory cell array, and output line 12 are used only by first cell array block 10, which is located at the edge. Accordingly, the length or load of output line 12 of selection control signal Pxi driver 14 is approximately one-half the length or load of output line 13 of selection control signal Pxi driver 16.

During the DRAM's operation, the discrepancy in the length of the output lines cause the amount of boosted voltage Vpp used by selection control signal Pxi driver 14 and output line 12, which are located at the edge of the memory cell array, to be approximately one-half of the amount of boosted voltage Vpp used by selection control signal Pxi driver 16 and output line 13, which are shared by two adjacent cell array blocks. The differing amount of boosted voltage Vpp used causes the boosted voltage Vpp level to fluctuate during the DRAM's operation. In DRAMs, fluctuating boosted voltage Vpp levels are undesirable.

FIG. 2 illustrates a diagram that explains the different amounts of boosted voltage used during a precharge in a conventional DRAM. Reference numerals 20, 21, 22, and 23 designate a first through fourth cell array block, respectively. Reference numerals 24, 25, and 26 designate shared sense amplifiers, where each shared sense amplifier is shared by two adjacent cell array blocks, Reference numerals 27, 28, 29, 30, 31, and 32 designate isolation transistor units.

As depicted in FIG. 2, in a memory device using a shared sense amplifier, a bit line of an inner cell array block, for example, second cell array block 21, is sensed by two shared sense amplifiers 24 and 25. Shared sense amplifier 24 is positioned along the upper side of second cell array block 21 and shared sense amplifier 25 is positioned along the lower side of second cell array block 21. In contrast, a bit line of an outer or edge cell array block, for example, first cell array block 20, is sensed by a single shared sense amplifier 24.

When sensing a bit line of one of two adjacent cell array blocks, the isolation transistor unit corresponding to the bit line of the cell array block that is not being sensed is turned off, effectively blocking the bit line from the shared sense amplifier. For example, when sensing a bit line of an outer cell array block (e.g., first cell array block 20), isolation transistor unit 28 is turned off to block a bit line of adjacent second cell array block 21 from shared sense amplifier 24. As another example, when sensing a bit line of an inner cell array block (e.g., second cell array block 21), isolation transistor unit 27 is turned off to block a bit line of adjacent first cell array block 20, and isolation transistor unit 30 is turned off to block a bit line of adjacent third cell array block 22.

During a precharge, which typically occurs after RAS becomes active, a blocked bit line is reconnected to a shared sense amplifier. Boosted voltage Vpp is used to reconnect a blocked bit line. For an outer cell array block, a bit line of one adjacent cell array block is reconnected to a shared sense amplifier during the precharge. For an inner cell array block, two bit lines, one from each adjacent cell array block, are connected to its respective shared sense amplifier during the precharge. The amount of boosted voltage Vpp used during the precharge is proportional to the number of bit lines reconnected during the precharge. Accordingly, during precharge, the amount of boosted voltage Vpp used in an outer cell array block is approximately one-half the amount of boosted voltage Vpp used in an inner cell array block.

In conventional semiconductor memory devices having shared circuits to reduce the size of a cell array block, the amount of boosted voltage Vpp used varies depending on the location of the activated cell array block. The boosted voltage Vpp amount or level fluctuates depending on the activated cell array block's location. Boosted voltage Vpp level fluctuations are undesirable because they tend to reduce the life span of the memory device and/or deteriorate the operating characteristics of the circuit.

SUMMARY

An object of the present invention is to provide a boosted voltage stabilization circuit that is capable of stabilizing the boosted voltage level for use in semiconductor memory devices.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein.

In one embodiment, a semiconductor memory device includes a cell array and a boosted voltage stabilization circuit. The cell array includes a plurality of memory cell array blocks sharing a predetermined circuit, wherein the predetermined circuit is operable to use a boosted voltage higher than a power supply voltage. The boosted voltage stabilization circuit includes an additional load, wherein the additional load is coupled to the boosted voltage when a memory cell array block at an edge of the cell array is selected.

In another embodiment, a semiconductor memory device includes a cell array and a boosted voltage stabilization circuit. The cell array includes one or more memory cell array blocks sharing a predetermined circuit, wherein the predetermined circuit is operable to use a boosted voltage higher than a power supply voltage. The boosted voltage stabilization circuit is operable for driving a predetermined circuit of an unselected memory cell array block at one edge of the cell array as a load when a signal indicating selection or non-selection of a memory cell array block at the other edge is activated.

In still another embodiment, a semiconductor memory device includes a cell array, a selection line, a boosted voltage line, and a boosted voltage stabilization circuit. The cell array includes one or more memory cell array blocks. The selection line is coupled to the cell array, and the selection line is operable to carry a signal indicating the selection of an a memory cell array block at an edge of the cell array. The boosted voltage line carrying a boosted voltage is coupled to the cell array. The boosted voltage stabilization circuit is coupled to the selection line, and the boosted voltage stabilization circuit includes an additional load, wherein the additional load is coupled to the boosted voltage line in response to detecting the signal on the selection line.

In yet another embodiment, a semiconductor memory device includes a boosted voltage line and a discharge circuit, wherein the boosted voltage line is coupled to a boosted voltage. The discharge circuit includes an additional load, and the discharge circuit is operable to couple the additional load to the boosted voltage line in a first state, and the discharge circuit is further operable to de-couple the additional load from the boosted voltage line in a second state.

In a further embodiment, in a semiconductor memory device, a method for facilitating the use of a uniform boosted voltage includes: providing a cell array having one or more memory cell array blocks; providing a boosted voltage line carrying a first boosted voltage value; detecting a selection or non-selection of a memory cell array block located at an edge in the cell array; in response to detecting the selection of a memory cell array block located at an edge in the cell array, coupling a load to the boosted voltage line, the load causing the first boosted voltage value on the boosted voltage line to drop to a second boosted voltage value; and in response to detecting the non-selection of a memory cell array block located at an edge in the cell array, de-coupling the load from the boosted voltage line and discharging the load.

These and other embodiments of the present invention will also become readily apparent to those skilled in the art from the following detailed description of the embodiments having reference to the attached figures, the invention not being limited to any particular embodiment(s) disclosed.

BRIEF DESCRIPTION OF THE DRAWINGS

Features and advantages of the present invention will become apparent by describing in detail specific embodiments thereof with reference to the accompanying drawings, in which.

DETAILED DESCRIPTION

The various embodiments of the present invention will be described more fully by referring to FIGS. 3 through 8 of the drawings.

In semiconductor memory devices, the amount of boosted voltage Vpp used depends on the location of the cell array block. Additionally, in typical semiconductor memory devices, cell array blocks share the predetermined circuits in order to reduce the size of the cell array. Accordingly, an outer cell array block may require a different amount of boosted voltage Vpp charge than an inner cell array block. When the amount of boosted voltage Vpp charge actually used is small and the amount compensated for is large, the level of the boosted voltage Vpp may greatly increase. In one embodiment, a dummy capacitor functioning as an additional load on the boosted voltage Vpp may be used to compensate for the location of the cell array block, and thus, permit the use of a single boosted voltage Vpp level.

For example, an outer cell array block requires less boosted voltage Vpp than an inner cell array block. Accordingly, when an outer cell array block is activated, the boosted voltage Vpp is used to charge a dummy capacitor to effectively reduce the boosted voltage Vpp level. Charging the dummy capacitor with the boosted voltage Vpp when an outer cell array block is activated allows a single boosted voltage Vpp charge to be used for both outer and inner cell array blocks. In the DRAM, a circuit that generates a signal when an outer cell array block (e.g., a cell array block that requires a lower boosted voltage Vpp level) is activated can be implemented. This signal can be used to determine whether to charge the dummy capacitor with the boosted voltage Vpp.

Figure 1:
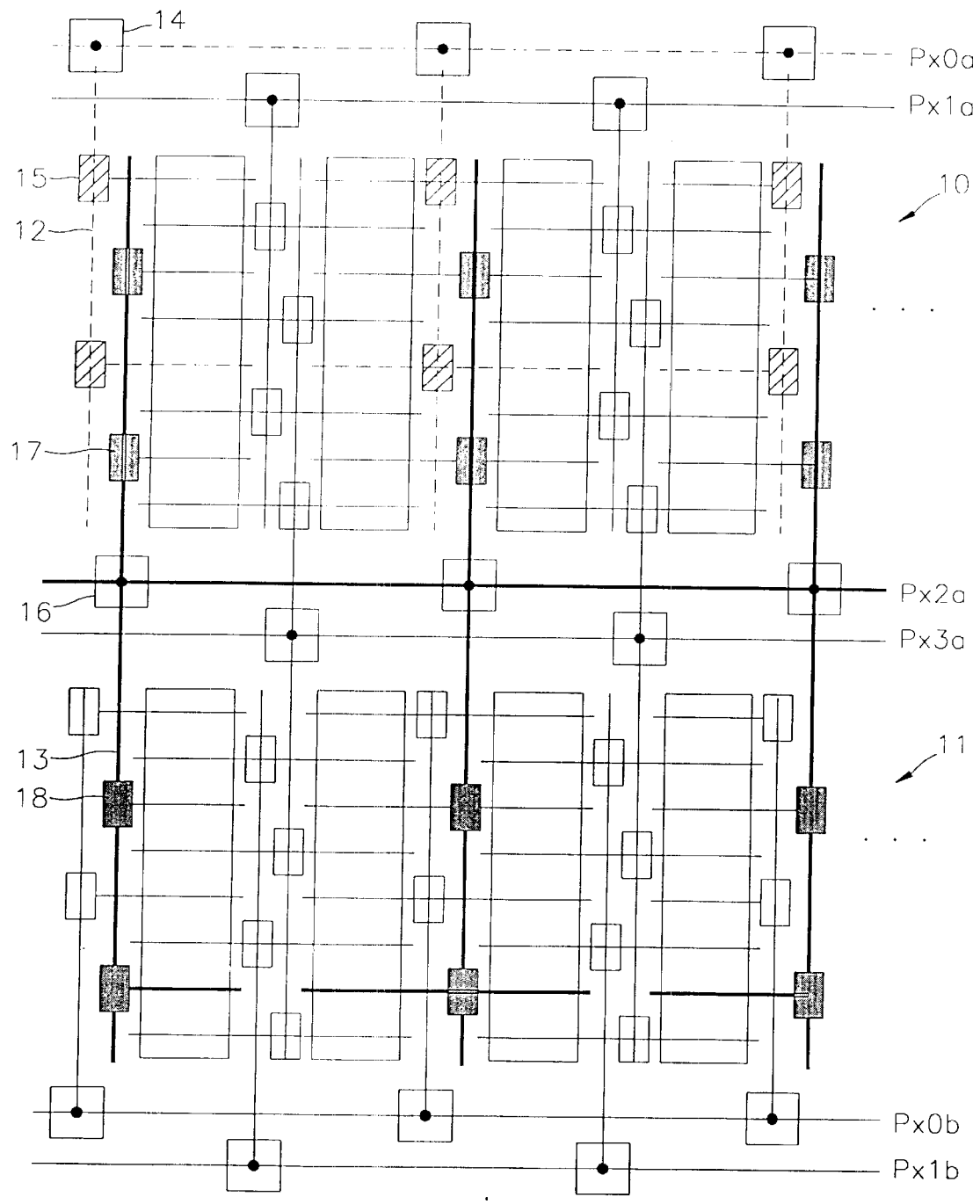
FIG. 1 is a diagram illustrating a main path through which a boosted voltage is applied when a row address strobe is active in a conventional semiconductor memory device.
Figure 2:
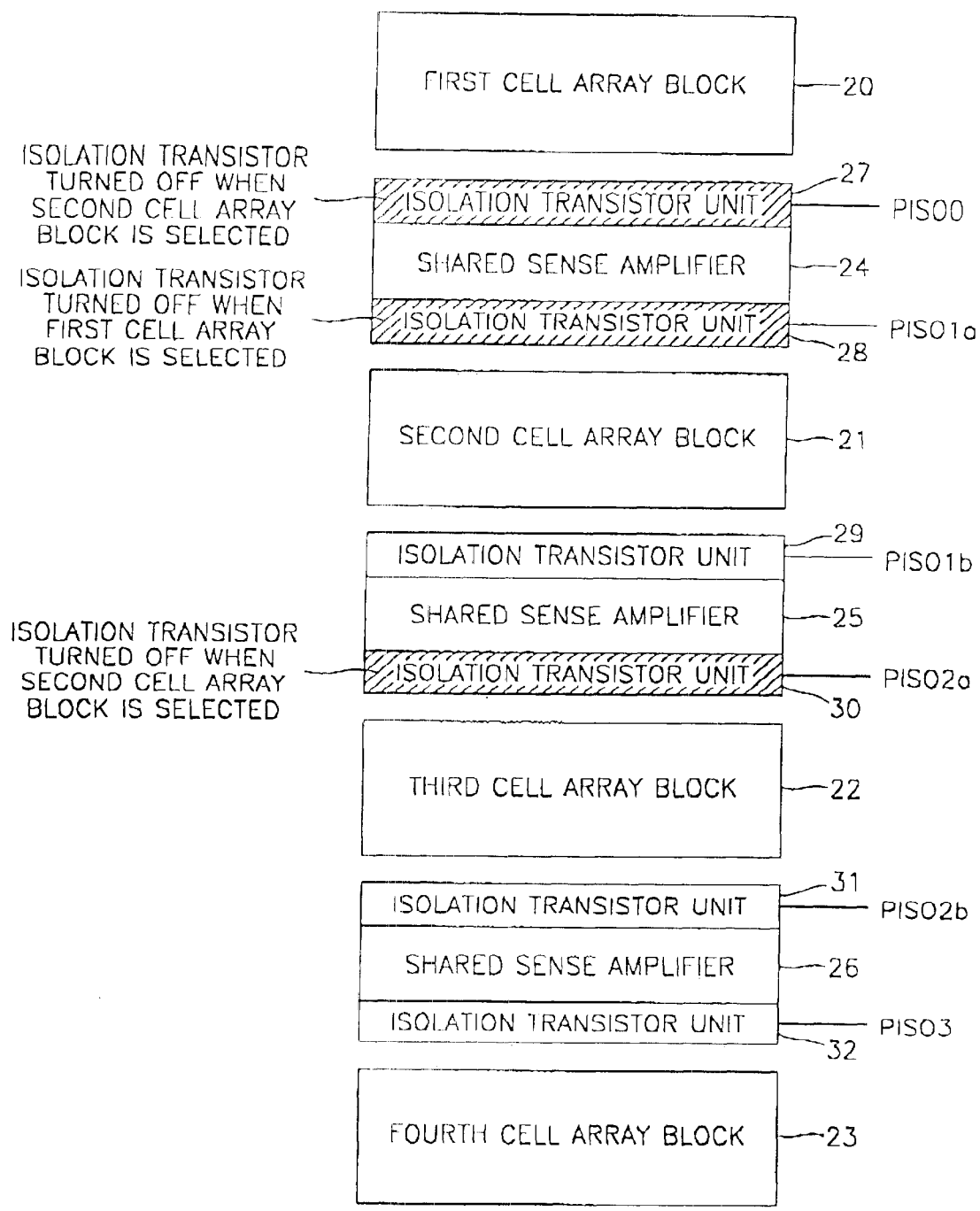
FIG. 2 illustrates a diagram that explains the different amounts of boosted voltage used during a precharge in a conventional semiconductor memory device.
Figure 3:
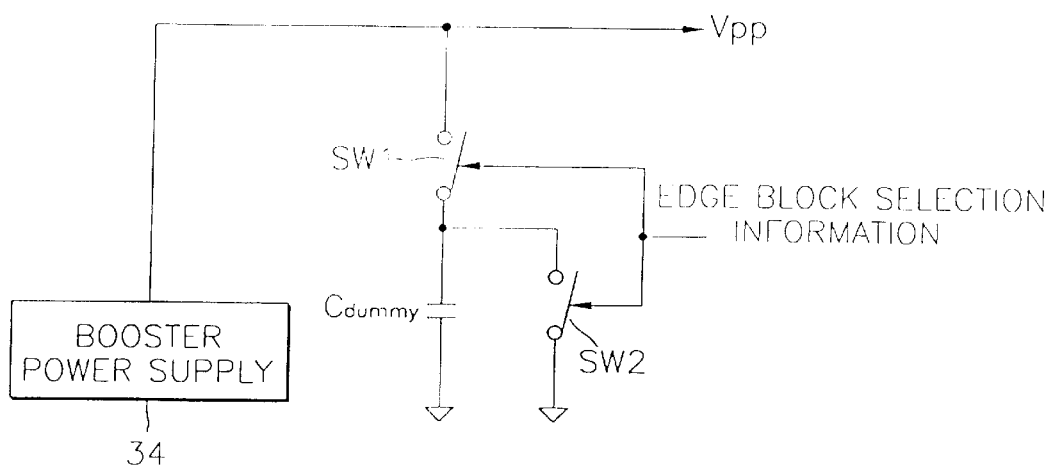
FIG. 3 illustrates an exemplary diagram of a boosted voltage stabilization circuit for use in a semiconductor memory device, according to one embodiment.

FIG. 3 illustrates an exemplary diagram of a boosted voltage stabilization circuit for use in a semiconductor memory device, according to one embodiment. As depicted, the boosted voltage stabilization circuit includes a dummy capacitor $C_{dummy}$, a first switching unit SW1, and a second switching unit SW2. The dummy capacitor $C_{dummy}$ becomes an additional load that is charged with the boosted voltage Vpp that is generated by a booster power supply 34 when a cell array block located at the edge of the cell array is selected. An edge block selection information signal controls first switching unit SW1. When first switching unit SW1 is closed, dummy capacitor $C_{dummy}$ appears as a load on the boosted voltage Vpp. Second switching unit SW2 is provided between one end of dummy capacitor $C_{dummy}$ and ground, and is also controlled by edge block selection information signal. When second switching unit SW2 is closed, the charge in dummy capacitor $C_{dummy}$ discharges to ground.

In the aforementioned boosted voltage stabilization circuit, when a memory cell array block located at the edge of a memory cell array is selected and driven, edge block selection information signal is "high," and first switching unit SW1 is closed. This causes the boosted voltage Vpp to charge an additional load (i.e., dummy capacitor $C_{dummy}$). When a memory cell array block at the edge is not selected, edge block selection information signal is "low," and first switching unit SW1 is open and second switching unit SW2 short-circuits (i.e., closes). This discharges the charge in dummy capacitor $C_{dummy}$ to ground. Here, dummy capacitor $C_{dummy}$ has a charge capacity sufficient to handle the amount of boosted voltage Vpp substantially equal to the amount of boosted voltage Vpp used by an inner cell array block and the amount of boosted voltage Vpp used by a cell array block located at the edge.

Boosted voltage Vpp is used during an active RAS and a precharge. In one embodiment, dummy capacitor $C_{dummy}$ may be implemented as a first dummy capacitor $C_{dummy}$ and a second dummy capacitor $C_{dummy}$. First dummy capacitor $C_{dummy}$ functions as an additional load that is charged with boosted voltage Vpp when a memory cell array block at the edge is selected during the active RAS. Second dummy capacitor $C_{dummy}$ functions as an additional load that is charged with boosted voltage Vpp when a memory cell array block at the edge is selected during the precharge.

Figure 4:
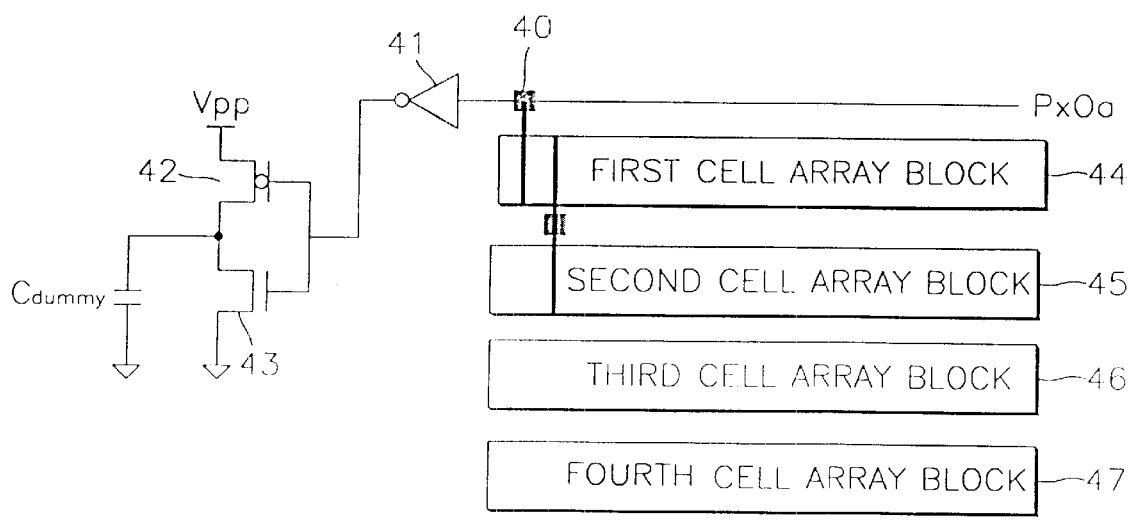
FIG. 4 illustrates an exemplary diagram of a boosted voltage stabilization circuit in a semiconductor memory device, according to one embodiment.
Figure 5:
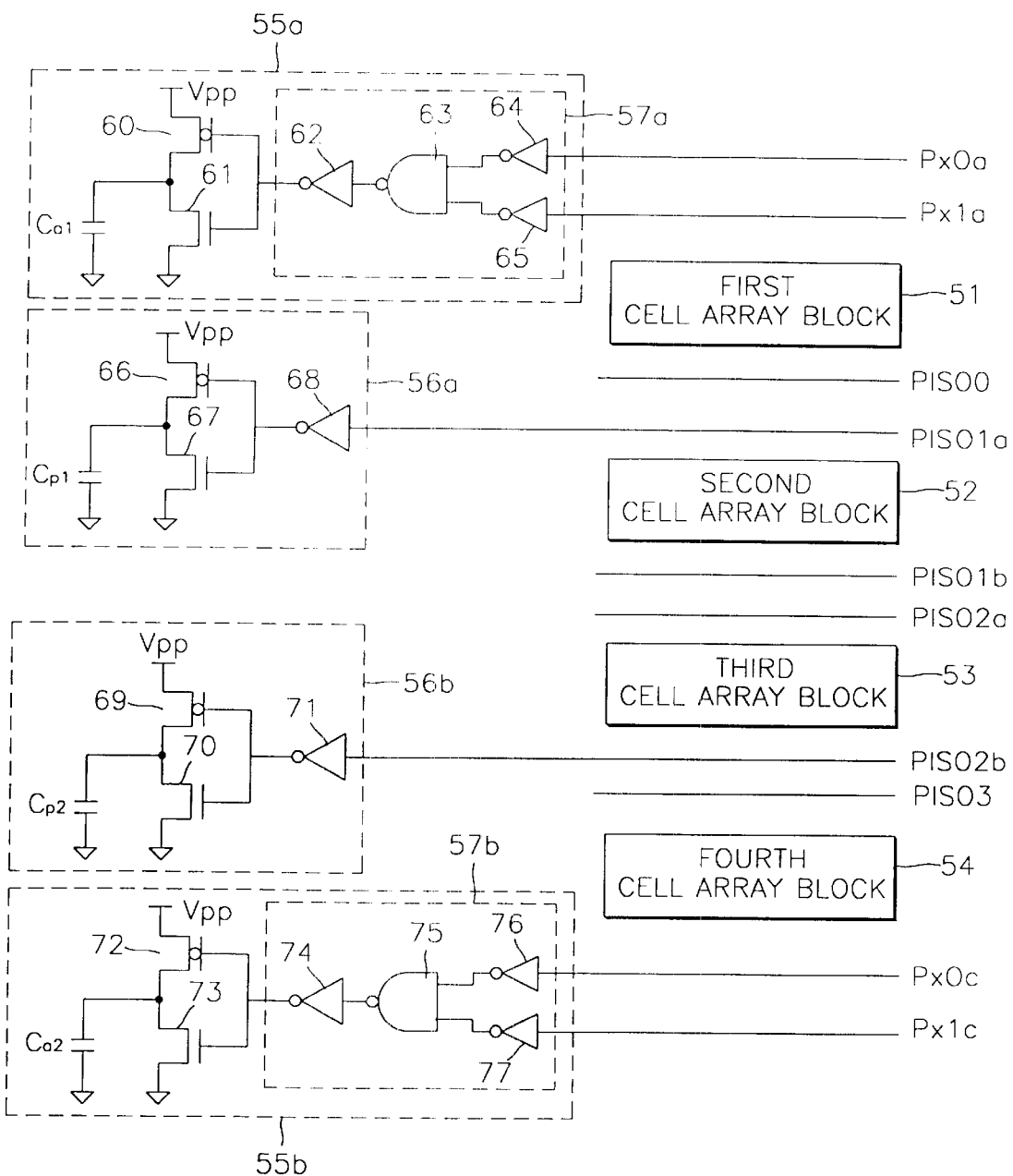
FIG. 5 illustrates an exemplary diagram of a semiconductor memory device having a boosted voltage stabilization circuit, according to one embodiment.

FIG. 5 illustrates an exemplary diagram of a semiconductor memory device having a boosted voltage stabilization circuit, according to one embodiment. FIG. 4 illustrates one embodiment of the boosted voltage stabilization circuit in the semiconductor memory device of FIG. 5. In FIG. 4, reference numerals 44, 45, 46, and 47 designate first through fourth cell array blocks, respectively. A PMOS transistor 42 functions as the first switching unit SW1 of FIG. 3, and an NMOS transistor 43 functions as the second switching unit SW2 of FIG. 3. Among row address decoding signals, a first signal Px0a, which is input to a selection control signal Pxi driver 40 to select first cell array block 44 at the edge of a cell array, functions as the edge block selection information signal of FIG. 3.

As depicted in FIG. 4, selection control Pxi driver 40 is coupled to an inverter 41, which in turn is coupled to PMOS transistor 42 and NMOS transistor 43. When first signal Px0a goes "high" to select first cell array block 44, inverter 41 outputs a "low" signal, thus turning on PMOS transistor 42, thereby charging dummy capacitor $C_{dummy}$ with boosted voltage Vpp. In this instance, dummy capacitor $C_{dummy}$ becomes an additional load on boosted voltage Vpp. Alternatively, when a cell array block at the edge is not selected (e.g., first signal Px0a goes "low"), PMOS transistor 42 is turned off and NMOS transistor 43 is turned on causing dummy capacitor $C_{dummy}$ to discharge its voltage to ground. In this instance, dummy capacitor $C_{dummy}$ is not an additional load on boosted voltage Vpp. Thus, the same boosted voltage Vpp level can be used for cell array blocks located near the edge of the cell array and cell array blocks located in the inside of the cell array.

With reference to FIG. 5, the semiconductor memory device having a boosted voltage stabilization circuit includes a first through fourth cell array blocks 51, 52, 53, and 54, first boosted voltage stabilizers 55a and 55b, and second voltage stabilizers 56a and 56b.

First boosted voltage stabilizer 55a includes a logic circuit 57a coupled to the gate of a PMOS transistor 60 and the gate of an NMOS transistor 61. Logic circuit 57a includes inverters 64 and 65 coupled to a NAND gate 63, which in turn is coupled to an inverter 62. Logic circuit 57a receives as input two signals Px0a and Px1a in inverters 64 and 65, respectively. Signals Px0a and Px1a indicate selection or non-selection of first cell array block 51, and are used to select first cell array block 51 at the edge of a cell array and a corresponding word line. Logic circuit 57a outputs a "low" signal when at least one of the two signals, Px0a and Px1a, is "high." PMOS transistor 60 source is coupled to boosted voltage Vpp, and PMOS transistor 60 drain is coupled to a first dummy capacitor $C_{a1}$. NMOS transistor 61 drain is also coupled to first dummy capacitor $C_{a1}$, and NMOS transistor 61 source is coupled to ground.

First boosted voltage stabilizer 55b includes a logic circuit 57b coupled to the gate of a PMOS transistor 72 and the gate of an NMOS transistor 73. Logic circuit 57b includes inverters 76 and 77 coupled to a NAND gate 75, which in turn is coupled to an inverter 74. Logic circuit 57b receives as input two signals Px0c and Px1c in inverters 76 and 77, respectively. Signals Px0c and Px1c indicate selection or non-selection of fourth cell array block 54, and are used to select fourth cell array block 54 at the edge of a cell array and a corresponding word line. Logic circuit 57b outputs a "low" signal when at least one of the two signals, Px0c and Px1c, is "high." PMOS transistor 72 source is coupled to boosted voltage Vpp, and PMOS transistor 72 drain is coupled to a second dummy capacitor $C_{a2}$. NMOS transistor 73 drain is also coupled to second dummy capacitor $C_{a2}$, and NMOS transistor 73 source is coupled to ground.

Second boosted voltage stabilizer 56a includes an inverter 68 coupled to the gate of a PMOS transistor 66 and the gate of an NMOS transistor 67. Inverter 68 receives and inverts a block breaking signal PISO1a which is applied to an isolation transistor unit (not shown) that is located opposite first cell array block 51 at the edge during precharge. PMOS transistor 66 source is coupled to boosted voltage Vpp, and PMOS transistor 66 drain is coupled to a third dummy capacitor $C_{p1}$. NMOS transistor 67 drain is also coupled to third dummy capacitor $C_{p1}$, and NMOS transistor 67 source is coupled to ground.

Second boosted voltage stabilizer 56b includes an inverter 71 coupled to the gate of a PMOS transistor 69 and the gate of an NMOS transistor 70. Inverter 71 receives and inverts a block breaking signal PISO2b which is applied to an isolation transistor unit (not shown) that is located opposite fourth cell array block 54 at the edge during precharge. PMOS transistor 69 source is coupled to boosted voltage Vpp, and PMOS transistor 69 drain is coupled to a fourth dummy capacitor $C_{p2}$. NMOS transistor 70 drain is also coupled to fourth dummy capacitor $C_{p2}$, and NMOS transistor 67 source is coupled to ground.

In the aforementioned semiconductor memory device, when a RAS signal is active, if one of the signals Px0a and Px1a is "high" (e.g., first cell array block 51 at the edge is selected), PMOS transistor 60 is turned on, thereby charging first dummy capacitor $C_{a1}$ with boosted voltage Vpp. When the two signals Px0a and Px1a are both "low," NMOS transistor 61 is turned on, thereby discharging the voltage in first dummy capacitor $C_{a1}$ to ground. Similarly, when a RAS signal is active, if one of the signals Px0c and Px1c is "high" (e.g., fourth cell array block 54 at the edge is selected), PMOS transistor 72 is turned on, thereby charging second dummy capacitor $C_{a2}$ with boosted voltage Vpp. When the two signals Px0c and Px1c are both "low," NMOS transistor 73 is turned on, thereby discharging the voltage in second dummy capacitor $C_{a2}$ to ground. Accordingly, the amount of boosted voltage Vpp used when edge cell array block 51 or 54 is activated is the same as the amount of boosted voltage Vpp used when inner cell array block 52 or 53 is activated, thereby stabilizing the level of boosted voltage Vpp.

In a semiconductor memory device that utilizes a shared sense amplifier, when a bit line of one of two adjacent cell array blocks is sensed, the bit line of the other adjacent cell array block that is not being sensed is disconnected from a shared sense amplifier. When a precharge command is received subsequent to the activation of a RAS, the previously disconnected bit line is reconnected to the shared sense amplifier. Boosted voltage Vpp is used to reconnect the bit line to the shared sense amplifier.

With continued reference to FIG. 5, block breaking signal PISO1a goes "high" in response to a precharge command received subsequent to selection and de-selection of first cell array block 51 by the activation and termination of the RAS, respectively. When PISO1a signal goes "high," PMOS transistor 66 is turned on, thereby charging third dummy capacitor $C_{p1}$ with boosted voltage Vpp. When PISO1a signal goes "low," NMOS transistor 67 is turned on, thereby discharging the voltage in third dummy capacitor $C_{p1}$ to ground. Similarly, block breaking signal PISO2b goes "high" in response to a precharge command received subsequent to selection and de-selection of fourth cell array block 54 by the activation and termination of the RAS, respectively. When PISO2b signal goes "high," PMOS transistor 69 is turned on, thereby charging fourth dummy capacitor $C_{p2}$ with boosted voltage Vpp. When PISO2b signal goes "low," NMOS transistor 70 is turned on, thereby discharging the voltage in fourth dummy capacitor $C_{p2}$ to ground. Accordingly, the amount of boosted voltage Vpp used when edge cell array block 51 or 54 is activated during precharge is the same as the amount of boosted voltage Vpp used when inner cell array block 52 or 53 is activated during precharge, thereby stabilizing the level of boosted voltage Vpp.

Figure 6:
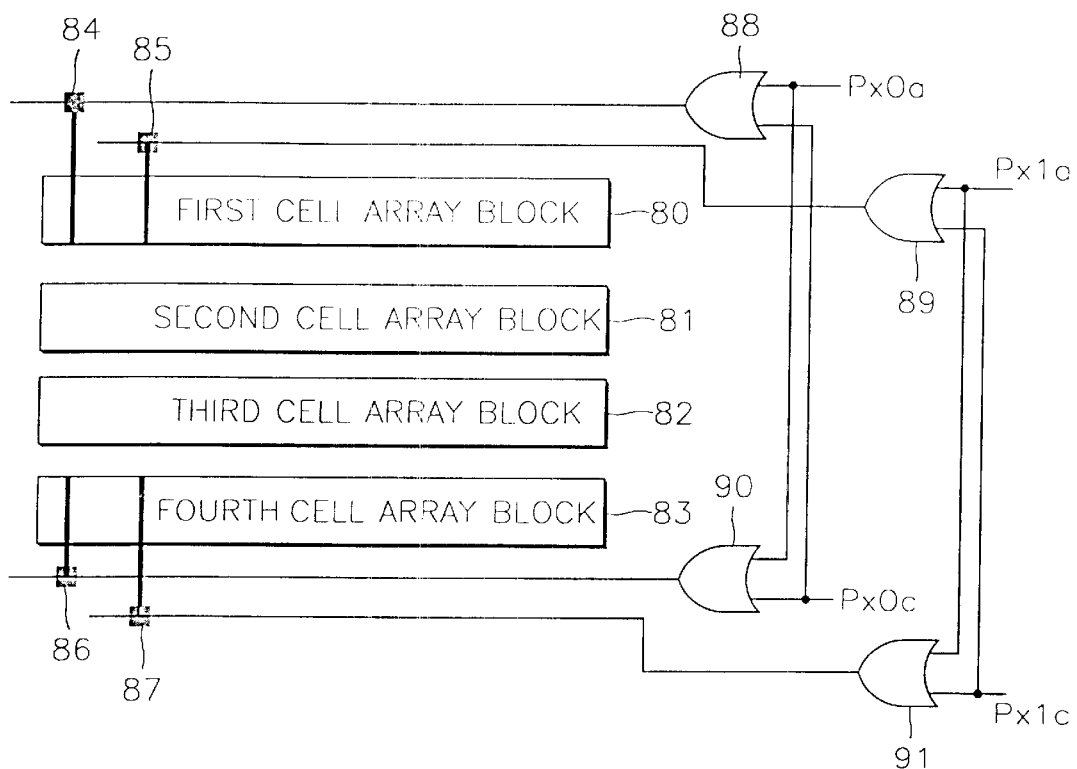
FIG. 6 illustrates an exemplary diagram of a semiconductor memory device having a boosted voltage stabilization circuit, according to another embodiment.
Figure 7:
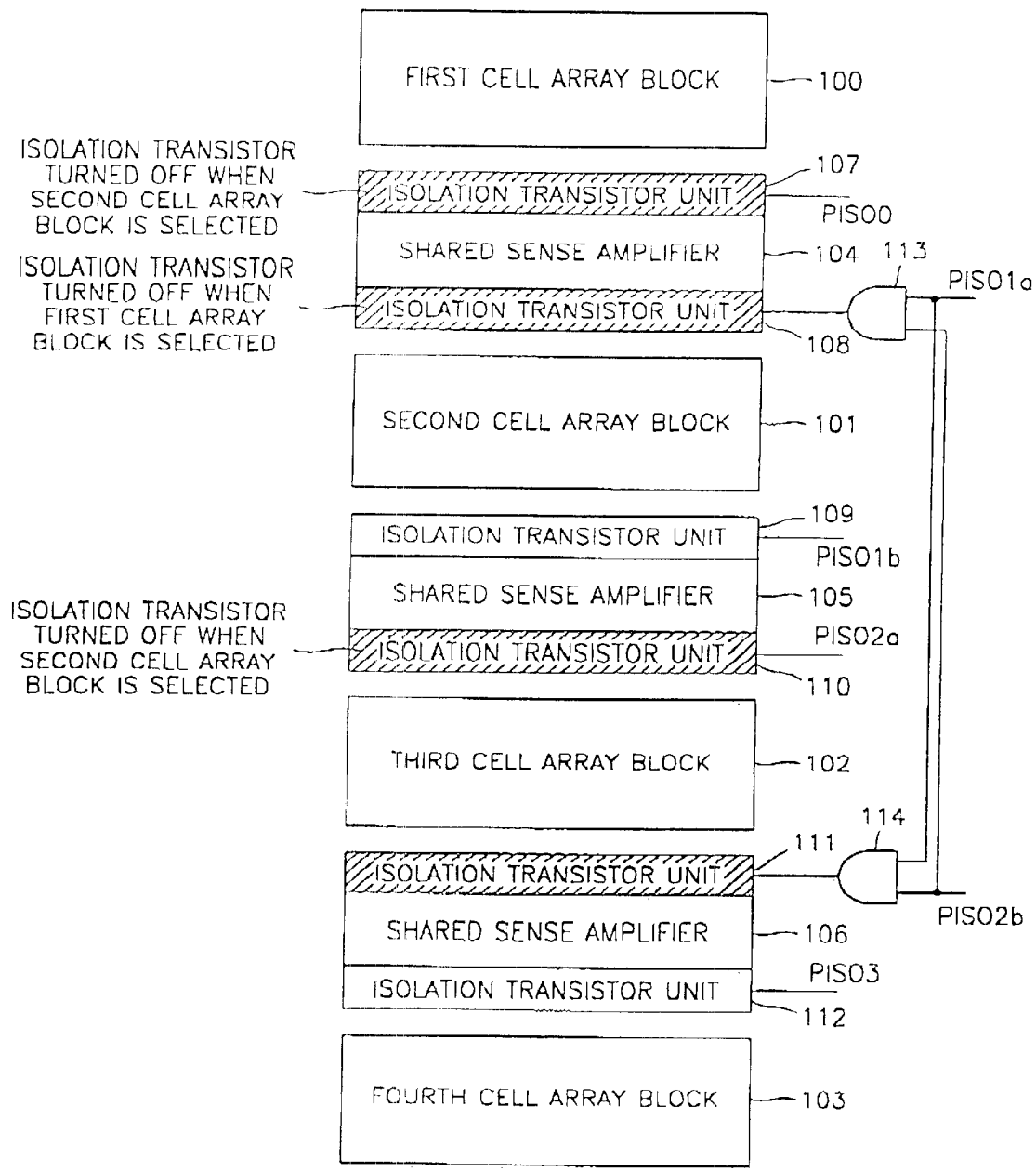
FIG. 7 illustrates an exemplary diagram of a semiconductor memory device having a boosted voltage stabilization circuit, according to still another embodiment.

FIG. 6 illustrates an exemplary diagram of a semiconductor memory device having a boosted voltage stabilization circuit, according to another embodiment. FIG. 7 illustrates an exemplary diagram of a semiconductor memory device having a boosted voltage stabilization circuit, according to still another embodiment. In both embodiments, when a signal that indicates selection of a cell array block at one edge is activated, a circuit in the unselected cell array block at the other edge is driven as a load.

As depicted in FIG. 6, the semiconductor memory device includes a first through fourth cell array blocks 80, 81, 82, and 83, selection control signal Pxi drivers 84, 85, 86, and 87 and OR gates 88, 89, 90, and 91. OR gates 88, 89, 90, and 91 operate as a boosted voltage stabilization circuit. Signal Px0a can be used to select first cell array block 80 and is input to one input of OR gate 88 and one input of OR gate 90. Signal Px0c can be used to select fourth cell array block 83 and is input to the other input of OR gate 88 and the other input of OR gate 90. Signal Px1a can be used to select first cell array block 80 and is input to one input of OR gate 89 and one input of OR gate 91. Signal Px1c can be used to select fourth cell array block 83 and is input to the other input of OR gate 89 and the other input of OR gate 91. The output of OR gates 88, 89, 90, and 91 are coupled to selection control signal Pxi drivers 84, 85, 86, and 87, respectively.

Activating any one of signals Px0a, Px1a, Px0c, and Px1c cause the pair of OR gates to which the activated signal is input to drive the coupled selection control signal Pxi drivers of the edge cell array blocks. For example, when signal Px0a used for selecting first cell array block 80 and a corresponding word line goes "high," both OR gates 88 and 90 output a "high" signal. The "high" signal output from OR gate 88 is input into and drives selection control signal Pxi driver 84. The "high" signal output from OR gate 90 is input into and drives selection control signal Pxi driver 86. Even though selection control Pxi driver 86 is driven, fourth cell array block 83 is not driven because its corresponding word line enable signal is not activated. Thus, there is no problem in operation. Accordingly, the amount of boosted voltage Vpp used when edge cell array block 80 or 83 is activated is the same as the amount of boosted voltage Vpp used when inner cell array block 81 or 82 is activated, thereby stabilizing the level of boosted voltage Vpp.

As depicted in FIG. 7, the semiconductor memory device includes a first through fourth cell array blocks 100, 101, 102, and 103, shared sense amplifiers 104, 105, and 106, isolation transistor units 107, 108, 109, 110, 111, and 112, and AND gates 113 and 114. AND gates 113, and 114 operate as a boosted voltage stabilization circuit. Block breaking signal PISO1a is input to one input of AND gate 113 and one input of AND gate 114. Block breaking signal PISO2b is input to the other input of AND gate 113 and the other input of AND gate 114.

When first cell array block 100 is selected, and when block breaking signal PISO1a is "low," the bit line of second cell array block 101 becomes disconnected from shared sense amplifier 104 (e.g., isolation transistor unit 108 is turned off when first cell array block 100 is selected), and AND gate 114 outputs a "low" signal to isolation transistor unit 111, thereby turning off the transistors in isolation transistor unit 111. Accordingly, similar to turning off the transistors in two isolation transistor units 107 and 110 when second cell array block 101 in the inside is selected, the transistors in two isolation transistor units 108 and 111 are turned off when first cell array block 100 at the edge is selected. Accordingly, by turning on the transistors that have been turned off in the two isolation transistor blocks 108 and 111 during precharge, the amount of boosted voltage Vpp used when selecting a cell array block at the edge can be made to be the same as the amount of boosted voltage Vpp used when selecting a cell array block in the inside, and thus, the level of boosted voltage Vpp can be uniformly maintained regardless of the location of a selected cell array block.

Similarly, when fourth cell array block 103 is selected, and when block breaking signal PISO2b is "low," the bit line of third cell array block 102 becomes disconnected from shared sense amplifier 106 (e.g., isolation transistor unit 111 is turned off when fourth cell array block 103 is selected), and AND gate 113 outputs a "low" signal to isolation transistor unit 108, thereby turning off the transistors in isolation transistor unit 108. Accordingly, similar to turning off the transistors in two isolation transistor units 107 and 110 when second cell array block 101 in the inside is selected, the transistors in two isolation transistor units 108 and 111 are turned off when fourth cell array block 103 at the edge is selected. Accordingly, by turning on the transistors that have been turned off in the two isolation transistor blocks 108 and 111 during precharge, the amount of boosted voltage Vpp used when selecting a cell array block at the edge can be made to be the same as the amount of boosted voltage Vpp used when selecting a cell array block in the inside, and thus, the level of boosted voltage Vpp can be uniformly maintained regardless of the location of a selected cell array block.

Figure 8:
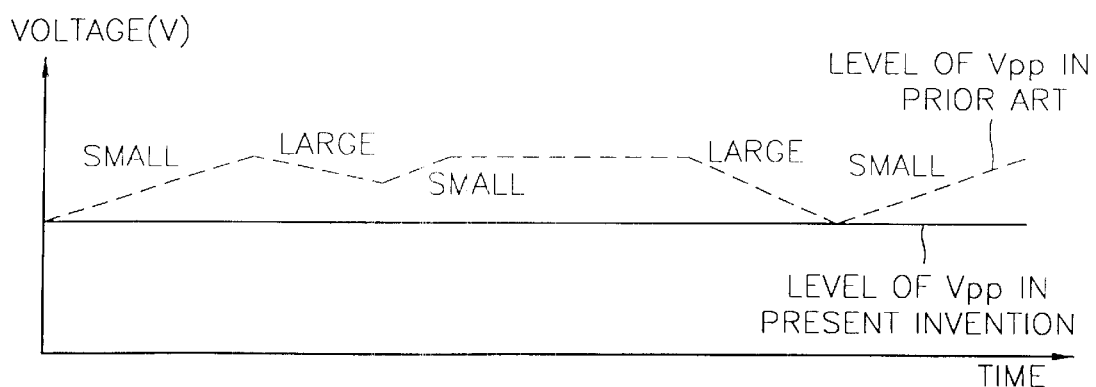
FIG. 8 is an exemplary diagram illustrating boosted voltage levels for a conventional semiconductor memory device and a semiconductor memory device having a boosted voltage stabilization circuit.

FIG. 8 is an exemplary diagram illustrating boosted voltage levels for a conventional semiconductor memory device and a semiconductor memory device having a boosted voltage stabilization circuit. As depicted, in conventional semiconductor memory devices, the load on the boosted voltage Vpp varies with the location of a selected cell array block, thus causing the boosted voltage Vpp level to fluctuate. In contrast, in a semiconductor memory device having a boosted voltage stabilization circuit according to one of the embodiments as disclosed herein, the boosted voltage Vpp level is uniform regardless of which cell array block in the semiconductor memory device is selected.

As described above, a semiconductor memory device having a boosted voltage stabilization circuit according to an embodiment of the present invention can maintain a uniform level of boosted voltage Vpp regardless of the location of the selected cell array block, thereby preventing the reduction in the life span of the memory device and/or the deterioration of the operating characteristics of the circuit normally caused by fluctuations in the boosted voltage Vpp.

Although the invention has been described with reference to particular embodiments, it will be apparent to one of ordinary skill in the art that various modifications and equivalent other embodiments can be made from the described embodiments. Therefore, the scope of the present invention is defined by the following claims.

What is claimed is:

1. A semiconductor memory device comprising:
a cell array comprising a plurality of memory cell array blocks sharing a predetermined circuit, the predetermined circuit operable to use a boosted voltage higher than a power supply voltage; and
a boosted voltage stabilization circuit comprising an additional load, wherein the additional load is coupled to the boosted voltage in response to a selection of a memory cell array block at an edge of the cell array.

2. The device of claim 1,
wherein the additional load is of a magnitude sufficient to result in a boosted voltage value that is equal to the difference between the boosted voltage value used in a memory cell array block in the inside of the cell array and the boosted voltage value used in a memory cell array block at the edge of the cell array.

3. The device of claim 1,
wherein the boosted voltage stabilization circuit further comprises a first switching unit coupled to the additional load, the first switching unit having as input the boosted voltage, the first switching unit operable to couple the boosted voltage to the additional load when the memory cell array block at the edge is selected.

4. The device of claim 3,
wherein the boosted voltage stabilization circuit further comprises a second switching unit provided between one end of the additional load and ground, the second switching unit operable to discharge a charged voltage in the additional load when a memory cell array block at the edge is not selected.

5. A semiconductor memory device comprising:
a cell array comprising a plurality of memory cell array blocks sharing a predetermined circuit, the predetermined circuit operable to use a boosted voltage higher than a power supply voltage; and
a boosted voltage stabilization circuit comprising an additional load,
wherein the additional load is coupled to the boosted voltage in response to a selection of a memory cell array block at an edge of the cell array,
and wherein the additional load comprises:
a first load which is charged with the boosted voltage when the memory cell array block at the edge is selected and a row address strobe signal is activated; and
a second load which is charged with the boosted voltage when a memory cell array block at the edge is selected during precharge.

6. The device of claim 5, wherein the boosted voltage stabilization circuit further comprises:
a first boosted voltage stabilizer for charging the first load with the boosted voltage in response to a first signal indicating selection or non-selection of the memory cell array block at the edge when the row address strobe signal is activated; and
a second boosted voltage stabilizer for charging the second load with the boosted voltage in response to a second signal indicating selection or non-selection of the memory cell array block at the edge during precharge.

7. The device of claim 6, wherein the first signal is for selecting the memory cell array block at the edge and a corresponding word line when the row address strobe signal is activated, and the second signal is a block breaking signal which is applied to an isolation transistor located opposite to the memory cell array block at the edge during precharge.

8. The device of claim 7, wherein the first boosted voltage stabilizer comprises:
   a logic circuit operable to receive a signal for selecting the memory cell array block at the edge and the corresponding word line, the logic circuit outputting a "low" signal when the memory cell array block at the edge is selected;
   a PMOS transistor having a gate coupled to receive the output signal from the logic circuit, a source coupled to receive the boosted voltage, and a drain coupled to one end of the first load; and
   an NMOS transistor having a gate coupled to receive the output signal from the logic circuit, a drain coupled to one end of the first load, and a source coupled to ground.

9. The device of claim 6, wherein the second boosted voltage stabilizer comprises:
   an inverter operable to receive and invert a block breaking signal;
   a PMOS transistor having a gate coupled to receive an output signal from the inverter, a source coupled to receive the boosted voltage, and a drain coupled to one end of the second load; and
   an NMOS transistor having a gate coupled to receive the output signal from the inverter, a drain coupled to one end of the second load, and a source coupled to ground.

10. A semiconductor memory device comprising:
   a cell array comprising a plurality of memory cell array blocks sharing a predetermined circuit, the predetermined circuit operable to use a boosted voltage higher than a power supply voltage; and
   a boosted voltage stabilization circuit for driving a predetermined circuit of an unselected memory cell array block at one edge of the cell array as a load in response to an activation of a signal indicating selection or non-selection of a memory cell array block at the other edge.

11. The device of claim 10, wherein the boosted voltage stabilization circuit comprises a first boosted voltage stabilizer for driving a word line driving circuit of a selected memory cell array block at one edge and driving a word line driving circuit of the unselected memory cell array block at the other edge as a load, when either a first signal for selecting the memory cell array block at one edge and a corresponding word line or a second signal for selecting the memory cell array block at the other edge and a corresponding word line is activated in the case where a row address strobe signal is activated.

12. The device of claim 11, wherein the first boosted voltage stabilizer comprises:
   a first ORing means for ORing the first signal and the second signal and outputting the result to the word line driving circuit of the memory cell array block at one edge, when the row address strobe signal is activated; and
   a second ORing means for ORing the first signal and the second signal and outputting the result to the word line driving circuit of the memory cell array block at the other edge, when the row address strobe signal is activated.

13. The device of claim 11, wherein the boosted voltage stabilization circuit comprises a second boosted voltage stabilizer for turning off the transistors of an isolation transistor unit located opposite to a selected memory cell array block at one edge and the transistors of an isolation transistor unit located opposite to the unselected memory cell array block at the other edge, when either a block breaking signal applied to the isolation transistor unit located opposite to the selected memory cell array block at one edge or a block breaking signal applied to the isolation transistor unit located opposite to the unselected memory cell array block at the other edge is a "low" level.

14. The device of claim 13, wherein the second boosted voltage stabilizer comprises a first and a second AND operation means for ANDing the block breaking signals that are applied to the isolation transistor units located opposite to the memory cell array blocks at both edges, and outputting the results to the isolation transistor units located opposite to the memory cell array blocks at both edges, respectively.

15. A semiconductor memory device comprising:
   a cell array comprising one or more memory cell array blocks;
   a selection line coupled to the cell array, the selection line operable to carry a signal indicating the selection of an a memory cell array block at an edge of the cell array;
   a boosted voltage line coupled to the cell array, the boosted voltage line carrying a boosted voltage; and
   a boosted voltage stabilization circuit coupled to the selection line, the boosted voltage stabilization circuit comprising an additional load, wherein the additional load is coupled to the boosted voltage line in response to detecting the signal on the selection line.

16. In a semiconductor memory device, a method for facilitating the use of a uniform boosted voltage, the method comprising:
   providing a cell array comprising one or more memory cell array blocks;
   providing a boosted voltage line carrying a first boosted voltage value;
   detecting a selection or non-selection of a memory cell array block located at an edge in the cell array;
   in response to detecting the selection of a memory cell array block located at an edge in the cell array, coupling a load to the boosted voltage line, the load causing the first boosted voltage value on the boosted voltage line to drop to a second boosted voltage value; and
   in response to detecting the non-selection of a memory cell array block located at an edge in the cell array, de-coupling the load from the boosted voltage line and discharging the load.

* * * * *